US006922367B2

United States Patent
Morzano et al.

(10) Patent No.: US 6,922,367 B2
(45) Date of Patent: Jul. 26, 2005

(54) DATA STROBE SYNCHRONIZATION CIRCUIT AND METHOD FOR DOUBLE DATA RATE, MULTI-BIT WRITES

(75) Inventors: Christopher K. Morzano, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/617,246

(22) Filed: Jul. 9, 2003

(65) Prior Publication Data

US 2005/0007836 A1 Jan. 13, 2005

(51) Int. Cl.[7] ................................................ G11C 7/00
(52) U.S. Cl. ...................................... 365/193; 365/233
(58) Field of Search ............................ 365/193, 189.05, 365/233

(56) References Cited

U.S. PATENT DOCUMENTS

| | | | | | |
|---|---|---|---|---|---|
| 6,034,916 | A | * | 3/2000 | Lee | 365/233 |
| 6,064,625 | A | | 5/2000 | Tomita | 365/233 |
| 6,081,477 | A | | 6/2000 | Li | 365/233 |
| 6,188,638 | B1 | | 2/2001 | Kuhne | 365/233 |
| 6,201,756 | B1 | | 3/2001 | Lee | 365/230.04 |
| 6,215,710 | B1 | | 4/2001 | Han et al. | 365/193 |
| 6,229,757 | B1 | * | 5/2001 | Nagata et al. | 365/233 |
| 6,288,971 | B1 | | 9/2001 | Kim | 365/233 |
| 6,292,410 | B1 | | 9/2001 | Yi et al. | 365/193 |
| 6,407,963 | B1 | * | 6/2002 | Sonoda et al. | 365/233.5 |
| 6,466,491 | B2 | | 10/2002 | Yanagawa | 365/194 |
| 6,529,993 | B1 | * | 3/2003 | Rogers et al. | 711/105 |
| 6,728,162 | B2 | * | 4/2004 | Lee et al. | 365/233 |
| 6,760,261 | B2 | | 7/2004 | Partsch et al. | 365/189.05 |
| 6,760,856 | B1 | | 7/2004 | Borkenhagen et al. | 713/401 |
| 6,771,552 | B2 | | 8/2004 | Fujisawa | 365/221 |
| 6,775,190 | B2 | | 8/2004 | Setogawa | 365/193 |
| 6,819,599 | B2 | | 11/2004 | Schaefer | 365/189.07 |

* cited by examiner

*Primary Examiner*—Son Mai
(74) *Attorney, Agent, or Firm*—Dorsey & Whitney LLP (57) ABSTRACT

A data strobe synchronization circuit includes first and second logic circuits receiving global data strobe pulses and respective enable signal. A control circuit initially applies an enable signal to the first logic circuit so that the first logic circuit generates a first data strobe pulse responsive to each global data strobe pulse. The control circuit receives a write control signal. When the write control signal becomes active, the control circuit terminates the enable signal applied to the first logic circuit and applies an enable signal to the second logic circuit. The second logic circuit then generates a second data strobe pulse responsive to the next global data strobe pulse. The first and second data strobe pulses are used to latch a data signal in respective flip-flops. The data strobe pulses may latch the data signal in pairs of flip-flops on the leading and trailing edges of the data strobe pulses.

62 Claims, 4 Drawing Sheets

DATA STROBE SYNCHRONIZATION CIRCUIT AND METHOD FOR DOUBLE DATA RATE, MULTI-BIT WRITES

TECHNICAL FIELD

This invention relates to memory devices, and, more particularly to a circuit and method for strobing multiple bits of write data into a double data rate memory device.

BACKGROUND OF THE INVENTION

Memory devices, such as dynamic random access memory ("DRAM") devices, are commonly used in a wide variety of applications, including personal computers. A great deal of effort has been devoted, and is continuing to be devoted, to increasing the speed at which memory devices are able to read and write data. Initially, memory devices operated asynchronously, and a single set of data were read from or written to the memory device responsive to a set of memory commands. The data bandwidth of memory devices were subsequently increased by reading and writing data in synchronism with a clock signal. Synchronously reading and writing data also allowed for other advances in the data bandwidth of memory devices, such as burst mode and page mode DRAMs, in which a large amount of data could be transferred with a single memory command.

Synchronous memory devices such as DRAMs initially transferred data in synchronism with one edge (either rising or falling) of a clock signal each clock cycle. However, with increases in the widths of data paths in synchronous memory devices, it subsequently became possible to transfer data in synchronism with both the rising edge and the falling edge of each clock cycle. As a result, these "double data rate" ("DDR") memory devices transferred data twice each clock cycle. When data is read from or written to a DDR memory device, the data registered with both edges of the clock signal are internally transferred in a single read or write operation. Therefore, although DDR memory devices support twice the data bandwidth of a conventional synchronous memory device, they operate internally at the same speed as a conventional memory device. DDR memory devices are able to provide twice the data bandwidth compared to conventional synchronous memory devices because they have internal data paths that are twice as wide as the data paths in conventional memory devices.

In an attempt to further increase the data bandwidth of memory devices, DDR2 memory devices have been developed. Date are transferred to or from DDR2 memory devices on each edge of two adjacent clock cycles, although, like conventional DDR memory device, data are transferred internally over a relatively wide data path in a single read or write operation. Thus, DDR2 memory devices have twice the data bandwidth of conventional DDR memory devices, which are now known as "DDR1" memory devices.

At high operating speeds, the timing of a data strobe ("DS") signal, which is used to capture write data at data bus terminals can vary somewhat. Therefore, in practice, a data strobe window exists during which data strobe signals are considered valid. The DS window is centered on each edge of a pair of DS pulses and extend before and after each edge by ¼ clock period. During each of these windows, the data applied to a data bus terminal of the memory device must be considered valid.

One problem that may exist with DDR2 memory devices is that noise on the DS line in a "preamble" prior to the first DS pulse may be misinterpreted as a DS pulse, particularly where the DS pulse is substantially delayed relative to the data. As a result, the first and second edges of the first DS pulse, (i.e., $DS_0$ and $DS_1$) will be interpreted as the third and fourth data strobe transitions $DS_2$ and $DS_3$, and the true $DS_2$ and $DS_3$ transitions will be ignored. Under these circumstances, the incorrect write data may be strobed into the memory device.

There is therefore a need for a circuit and method that is substantially immune to noise on the data strobe line of DDR2 memory devices to avoid capturing spurious data.

SUMMARY OF THE INVENTION

A data strobe synchronization circuit generates first data strobe signals responsive to global data strobe signals, but does not generate a second data strobe signal responsive to a global data strobe signal until a write control signal is generated. The data strobe signals are used to store respective samples of a data signal in respective storage devices so that data signal samples obtained responsive to the first data strobe signals are overwritten with data signal samples obtained responsive to subsequent data strobe signals. When the write control signal is generated, the first data strobe signals are no longer generated responsive to the global data strobe signals. As a result, a data signal sample last obtained prior to the write control signal being generated is saved and a data signal sample obtained after the write control signal is saved.

DETAILED DESCRIPTION OF THE INVENTION

Figure 1:
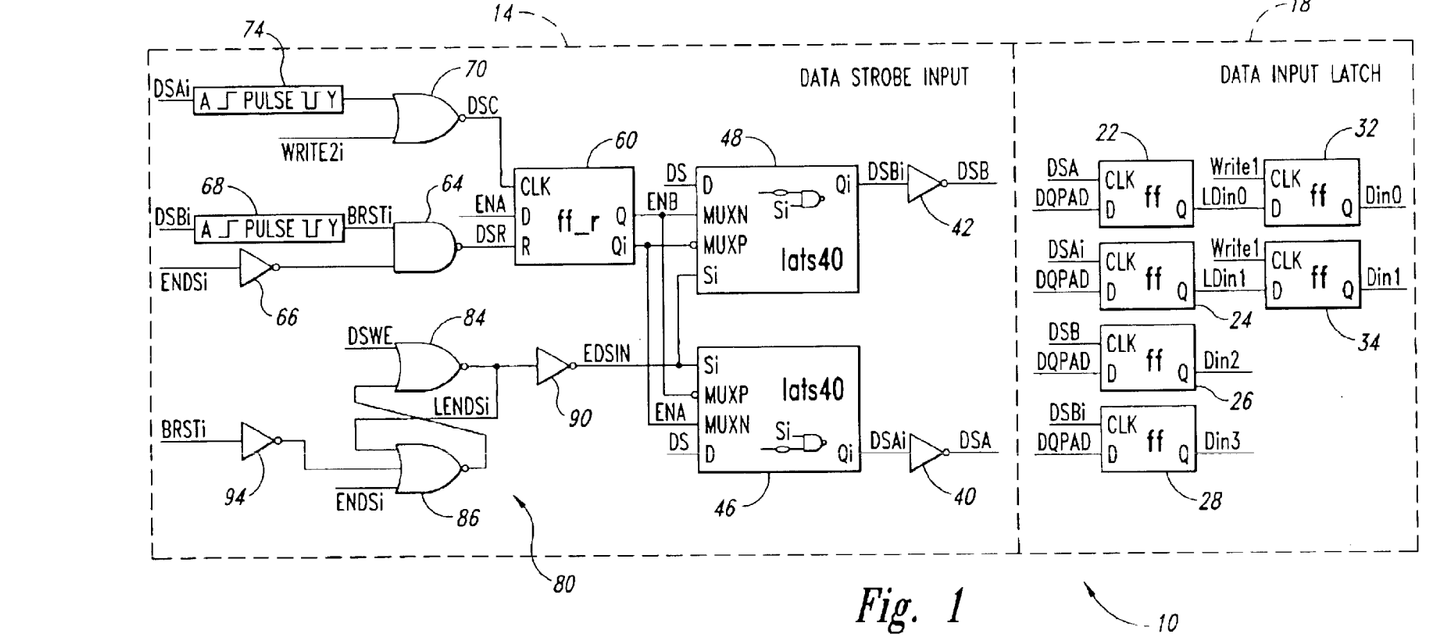
FIG. 1 is a logic diagram a data strobe circuit and method according to one embodiment of the invention.

One embodiment of a data strobe circuit 10 that is insensitive to noise on data strobe lines and thus captures write data responsive only to valid data strobes is shown in FIG. 1. As explained more fully below, the circuit 10 operates by strobing data on each transition of a DS pulse on a data strobe DS line, saving the data strobed on the last two transitions prior to a predetermined write command, and saving the data strobed on the first two transitions following the predetermined write command. As a result, any data strobed by noise signals in the preamble are overwritten with correctly strobed data.

With reference to FIG. 1, the data strobe circuit 10 includes a data strobe input circuit 14 and a data input latch circuit 18. As described in greater detail below, the data strobe input circuit 14 functions to generate data strobe signals, and the data input latch circuit 18 uses those strobe signals to latch four bits of write data.

The data input latch circuit 18 includes 4 flip-flops 22, 24, 26, 28 each of which includes a data ("D") input coupled to a respective DQPAD line. The DQPAD lines to of all of the flip-flops 22–28 are coupled to a common data bus terminal (not shown). The flip-flops 22–28 are clocked by a respective data strobe signal, DSA, DSAi, DSB, DSBi, where the "i" designates a complement signal. Thus, DSAi is the complement of DSA. As explained below, the DSA, DSAi, DSB and DSBi signals are generated by the data strobe input circuit 14. The DSA signal is the data strobe for the first data bit, the DSAi signal is the data strobe for the second data bit, the DSB signal is the data strobe for the third data bit, and the DSBi signal is the data strobe for the fourth data bit. Thus, after all of these data strobe signals have occurred, the collective write data for a single write cycle are captured by the flip-flops 22–28.

The first and second write data bits are applied as Ldin0 and Ldin1 signals to the data inputs of respective flip-flops 32, 34. The flip-flops 32, 34 are clocked by a Write1 signal, which is conventionally generated in DDR2 memory devices one clock cycle before the write data are written to an array of memory cells in the memory device. The flip-flops 32, 34 then output respective first and second bits of write data, Din0 and Din1, respectively. The third and fourth bits of write data, Din2 and Din3, are output directly from the flip-flops 26, 28 at about the same time that the Write1 signal becomes active. The flip-flops 32, 34 are used to output the first and second bits of write data to the memory array so that all four bits of write data will be presented to the memory array at substantially the same time.

As mentioned previously, the data input latch circuit 18 generates the data strobe signals, DSA, DSAi, DSB and DSBi at the proper time, and it does so in a manner that does not result in the capture of data responsive to noise signals. The DSA signal is generated by an inverter 40 from its complimentary DSAi signal, and the DSB signal is similarly generated by an inverter 42 from its complimentary DSBi signal. The DSAi and DSBi signals are, in turn, generated by respective logic circuits 46, 48. The function of the logic circuits 46, 48 is to pass a global data strobe DS signal whenever the logic circuit 46, 48 is enabled by a high enable data strobe input ("EDSIN") signal and either the logic circuit 46 or the logic circuit 48 is selected by a high ENA or ENB signal, respectively.

Figure 2:
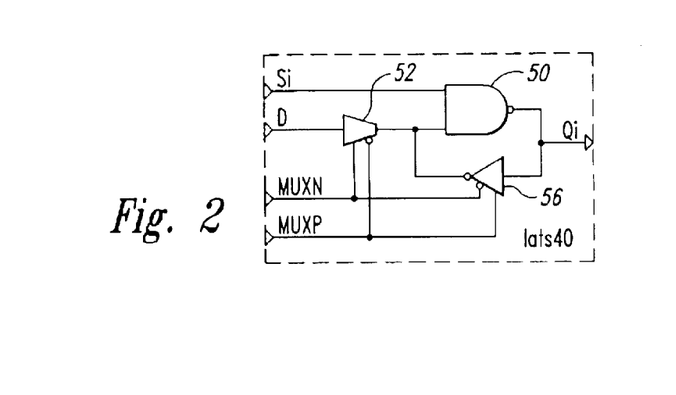
FIG. 2 is a logic diagram of one embodiment of a logic circuit used in the data strobe circuit of FIG. 1.

One embodiment of the logic circuit 46, 48 is illustrated in FIG. 2. The logic circuit 46, 48 includes a NAND gate 50 that is enabled by a high Si input, which, as shown in FIG. 1, is coupled to receive the EDSIN signal. As explained in greater detail below, the EDSIN signal is switched to active high by a write enable signal and is switched to inactive low when 4 bits of data have been captured by the data strobe signals DSA, DSAi, DSB and DSBi, respectively.

The other input to the NAND gate 50 is coupled to the output of a multiplexer 52 that receives the data strobe DS signal at its data input and is enabled by an active high MUXN signal and an active low MUXP signal. As shown in FIG. 1, the MUXN signal is active high and the MUXP signal is active low whenever the ENA or ENB signal coupled to the logic circuits 46, 48, respectively, is active high. Thus, the output of the NAND gate 50 will be the compliment of the DS signal whenever the EDSIN signal is active high and the respective enable signal ENA or ENB is high. The output of the NAND gate is coupled to the multiplexer input to the NAND gate 50 by an inverter 56 so that the output of the NAND gate 50 will be latched after the multiplexer 52 is disabled. The latched output of the NAND gate 50 is reset high when the EDSIN signal transitions low as described below.

Returning to FIG. 1, since the logic circuits 46, 48, the ENA and ENB signals that enable the logic circuits 46, 48 are generated by a flip-flop 60. However, since the active high MUXN for the logic circuit 46 is coupled to the Qi output of the flip-flop 60 and the active high MUXN for the logic circuit 48 is coupled to the Q output of the flip-flop 60, the logic circuits 46, 48 are alternatively enabled. More specifically, when the flip-flop 60 is reset, the logic circuit 46 is enabled. Setting the flip-flop 60 then enables the logic circuit 48.

The flip-flop 60 is reset by a high at the output of a NAND gate 64, which occurs whenever either input to the NAND gate 64 is low. An active low enable data strobe ENDSi signal is normally low, so an inverter 66 normally enables the NAND gate 64. The other input to the NAND gate 64 is coupled to a pulse generator 68, which outputs a low-going pulse responsive to a rising edge of the DSBi signal. As explained above, the DSBi signal is generated by the logic circuit 48, and it transitions high upon strobing the fourth data bit into the flip-flop 28. Thus, the flip-flop 60 is reset to enable the logic circuit 46 when the logic circuit 48 outputs the data strobe signal DSBi to strobe the fourth bit of data.

The flip-flop 60 is clocked by a DSC signal at the output of a NOR gate 70. The signal applied to the data D input of the flip-flop 60 is the ENA signal that is generated at the Qi output of the flip-flip 60. Therefore, the flip-flop 60 toggles when clocked by the output of the DSC signal. The NOR gate 70 is enabled by an active low Write2i signal, which is generated 2 clock periods before data are written to a memory array in a memory device containing the data strobe circuit 10. When enabled 2 clock periods before a data write operation, the flip-flop 60 is clocked by a pulse from a pulse generator 74, which occurs on the rising edge of the DSAi signal. As explained above, the DSAi signal is used to latch the second bit of data into the flip-flop 24. The DSAi signal transitions high when the DS signal applied to the logic circuit 46 transitions low and the logic circuit 46 is enabled. Thus, the logic circuit 46 is initially enabled so that the DSA and DSAi signals are continuously generated from the DS signal. The trailing edges of the DSAi pulses cause the pulse generator 74 to apply respective pulses to the NOR gate 70. However, these pulses are ignored until 2 clock periods before a write operation because the Write2i signal is inactive high. When the Write2i signal becomes active low, the rising edge of the next DSAi pulse causes a DSC pulse to be generated, which toggles the flip-flop 60 to enable the logic circuit 48. The logic circuit 48 then generates the DSB and DSBi signals from the next two transitions of the DS signal. As previously explained, these DSB and DSBi signals latch the third and fourth bits of data into the flip-flops 26, 28, respectively. The rising edge of the DSBi signal used to latch the fourth bit of data triggers the pulse generator 68 to generate a pulse that resets the flip-flop 60 to again enable the logic circuit 46. In summary, when the Write2i signal becomes active, the data strobe circuit 10 strobes the two bits of data into the flip-flops 22, 24, respectively, on the last two DS transitions prior to the Write2i signal becoming active. The data strobe circuit 10 then strobes the next two bits of data into the flip-flops 26, 28, respectively.

As mentioned above the logic circuits 46, 48 are enabled by an EDSIN signal applied to their Si inputs. The EDSIN signal is generated by a flip-flop 80 formed by two NOR gates 84, 86, the output of which is coupled through an inverter 90. The flip-flop 80 is set to enable the logic circuit 46, 48 by applying a high data strobe write enable DSWE signal to the NOR gate 84. The flip-flop 80 is reset to disable the logic circuits 46, 48 and reset their outputs high either applying an active low BRSTi signal to an inverter 94 or by applying an inactive high ENDSi signal to the NOR gate 86. However, as mentioned above, the ENDSi signal is normally active low during the operation of the data strobe circuit 10, so the NOR gate 86 is normally enabled. A low transitioning BRSTi pulse, which resets the flip-flop 80, is generated at the output of the pulse generator 68 whenever the DSBi signal transitions high. As previously explained, this occurs when the fourth bit of data is latched into the flip-flop 28. However, since the DSWE is normally high when the data strobe circuit 10 is active, these BRSTi pulses do not reset the flip-flop 80 to disable the logic circuits 46, 48. However, when the data strobe circuit 10 is to be disabled for a write operation, the DSWE signal transitions low to allow the BRSTi pulse to be generated when the fourth bit of data has been strobed into the flip-flop 28.

Figure 3:
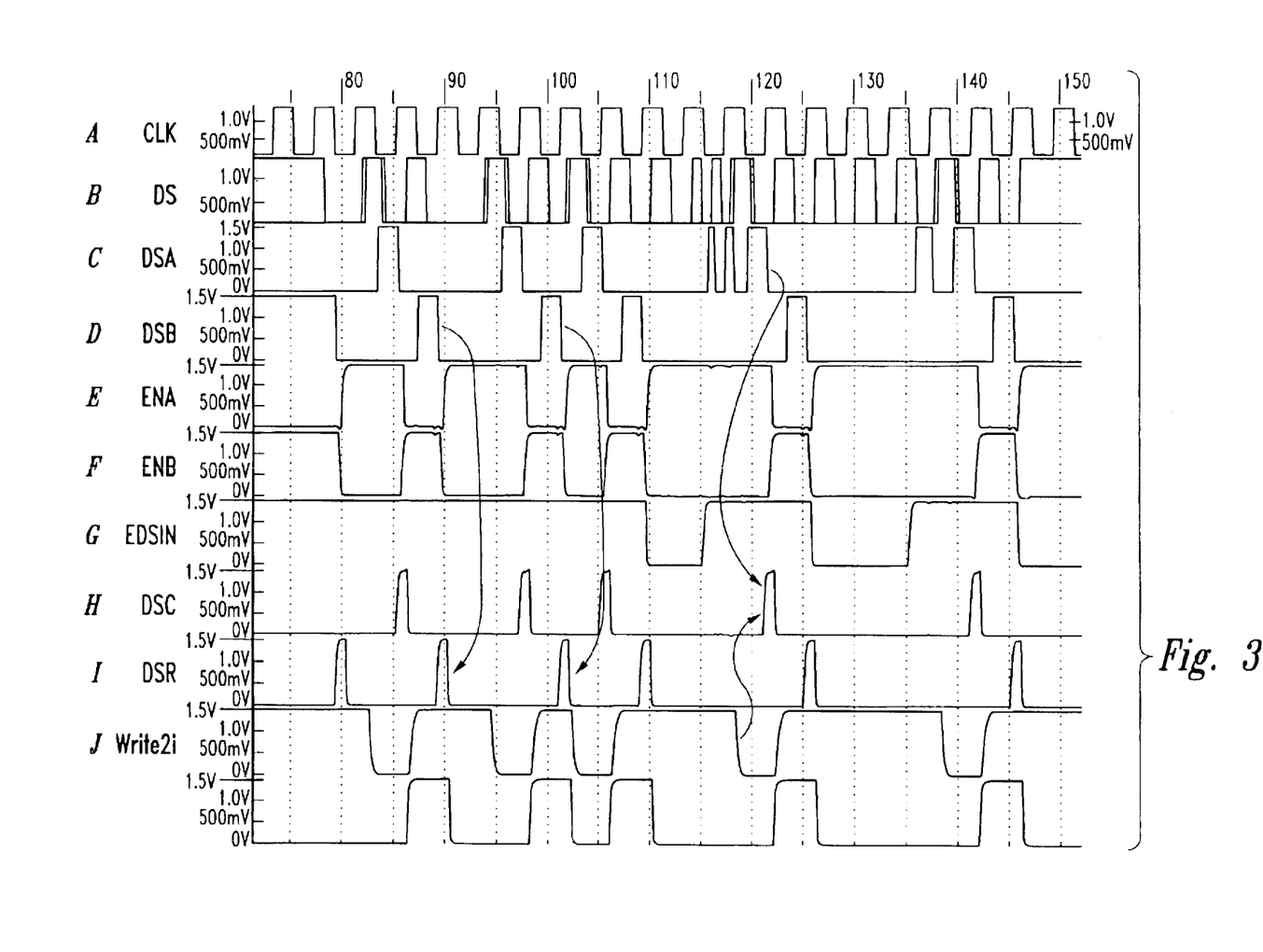
FIGS. 3A–3J are timing diagrams showing various signals present in the data strobe circuit of FIG. 1.

The operation of the entire data strobe circuit 10 will now be explained with reference to the timing diagram shown in FIG. 3, which shows various signals present in the circuit of FIG. 2 over a 150 ns time period as indicated at the top of FIG. 3. FIG. 3A shows a clock signal that provides the basic timing for a memory device (not shown) containing the data strobe circuit 10 of FIG. 1. FIG. 3B shows a data strobe signal DS having several pulse pairs each of which is used for strobing 4 bits of data into the memory device. As further shown in FIG. 3B, a pair of noise pulses occur on the DS line starting at about 115 ns. As explained above, the logic circuit 46 is initially enabled so that each DS pulse shown in FIG. 3B causes a DSA pulse to be generated, as shown in FIG. 3C. This DSA pulse latches the first and second data bits into the flip-flops 22, 24, respectively. When each DSA pulse is generated, the Write2i signal shown in FIG. 3J is active low so that the falling edge of the DSA pulse (the rising edge of the DSAi pulse) causes a DSC pulse to be generated at the output of the NOR gate 70, as shown in FIG. 3H. Each of these DSC pulses toggles the flip-flop 60, thereby disabling the logic circuit 46 and enabling the logic circuit 48. As a result, the subsequent DS pulse causes a DSB pulse to be generated, as shown In FIG. 3D. Each DSB pulse latches the third and fourth data bits into the flip-flops 26, 28, respectively, and causes a DSR pulse to be generated at the output of the NAND-gate 64, as shown in FIG. 3I. This DSC pulse resets the flip-flop 60, thereby enabling the logic circuit 46 and disabling the logic circuit 48 so that the subsequent DS pulse generates a DSA pulse rather than a DSB pulse, as explained above.

The manner in which the data strobe circuit 10 is insensitive to noise pulses on the data strobe line DS will now be explained with reference to FIGS. 1 and 3. When the noise pulses are generated between 115–120 ns, they each cause a DSA pulse to be generated as shown in FIG. 3C, which latches data into the flip-flops 22, 24. However, when the first true DS pulse occurs at the 120 ns time, the spurious data latched into the flip-flops 22, 24 is overwritten with data latched by the leading and trailing edges of this DS pulse. Significantly, the noise pulses do not toggle the flip-flop 60, which would result in the disabling of the logic circuit 46 and enabling of the logic circuit 48. If the logic circuit 48 was enabled, the true DS signal would generate a DSB pulse, which would latch the first and second data bits into the flip-flops 26, 28 for the third and fourth data bits. The reason why the noise pulses do not toggle the flip-flop 60 is that the Write2i signal shown in FIG. 3J is inactive high when the noise pulses are present. As a result, the falling edge of the DSA signal is not coupled through the nor gate 70, and it therefore cannot clock the flip-flop 60. Thus, the first DS pulse occurring after the noise pulses causes the first and second data bits to be latched into the flip-flop 22, 24, and the second DS pulse occurring after the noise pulses causes the third and fourth data bits to be latched into the flip-flops 26, 28. The data strobe circuit 10 is thus insensitive to noise pulses in the preamble prior to the first DS pulse.

Figure 4:
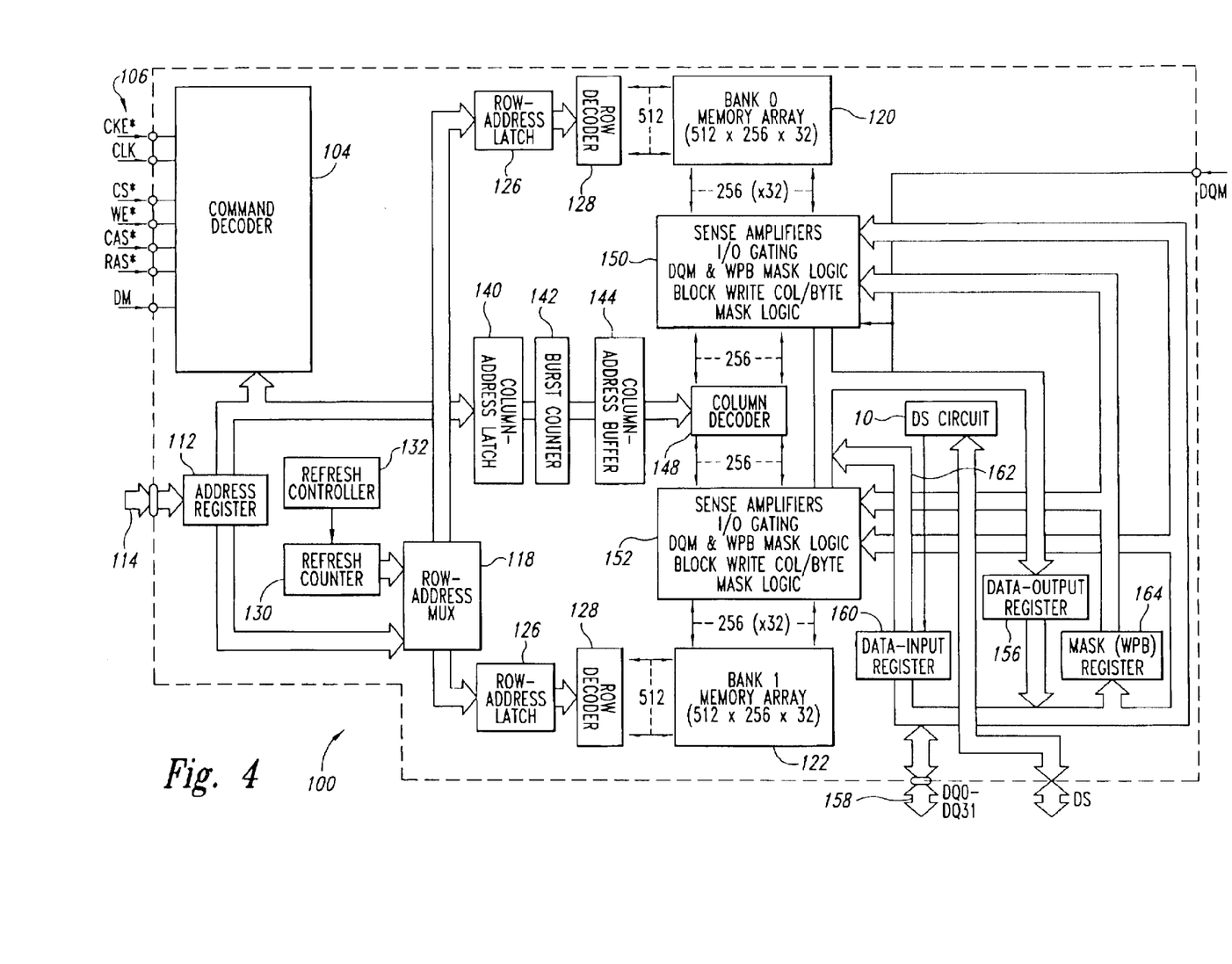
FIG. 4 is a block diagram of one embodiment of a memory device using the data strobe circuit of FIG. 1.

One embodiment of a memory device using the data strobe circuit 10 of FIG. 1 or some other embodiment of the invention is shown in FIG. 4. The memory device illustrated therein is a synchronous dynamic random access memory ("SDRAM") 100, although the invention can be embodied in other types of synchronous DRAMs, such as packetized DRAMs and RAMBUS DRAMs (RDRAMS"), as well as other types of digital devices. The SDRAM 100 includes an address register 112 that receives either a row address or a column address on an address bus 114. The address bus 114 is generally coupled to a memory controller (not shown in FIG. 4). Typically, a row address is initially received by the address register 112 and applied to a row address multiplexer 118. The row address multiplexer 118 couples the row address to a number of components associated with either of two memory arrays 120, 12 depending upon the state of a bank address bit forming part of the row address.

Associated with each of the memory arrays 120, 122 is a respective row address latch 126, which stores the row address, and a row decoder 128, which applies various signals to its respective array 120 or 122 as a function of the stored row address. These signals include word line voltages that activate respective rows of memory cells in the memory arrays 120, 122. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132.

After the row address has been applied to the address register 112 and stored in one of the row address latches 126, a column address is applied to the address register 112. The address register 112 couples the column address to a column address latch 140. Depending on the operating mode of the SDRAM 100, the column address is either coupled through a burst counter 142 to a column address buffer 144, or to the burst counter 142 which applies a sequence of column addresses to the column address buffer 144 starting at the column address output by the address register 112. In either case, the column address buffer 144 applies a column address to a column decoder 148 which applies various signals to respective sense amplifiers and associated column circuitry 150, 152 for the respective arrays 120, 122.

Data to be read from one of the arrays 120, 122 is coupled to the column circuitry 150, 152 for one of the arrays 120, 122, respectively. The data is then coupled through a read data path 154 to a data output register 156, which applies the data to a data bus 158.

Data to be written to one of the arrays 120, 122 is coupled from the data bus 158 through a data input register 160 and a write data path 162 to the column circuitry 150, 152 where it is transferred to one of the arrays 120, 122, respectively. The data strobe circuit 10 is coupled to the data input register 160 to latch four bits of data sequentially applied to the data bus 158 responsive to an externally generated data strobe ("DS") signal. These four bits of data are then coupled through the write data path 162 to the column circuitry 150, 152. A mask register 164 may be used to selectively alter the flow of data into and out of the column circuitry 150, 152, such as by selectively masking data to be read from the arrays 120, 122.

The above-described operation of the SDRAM 100 is controlled by a command decoder 104 responsive to command signals received on a control bus 170. These high level command signals, which are typically generated by a memory controller (not shown in FIG. 4), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 104 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 5:
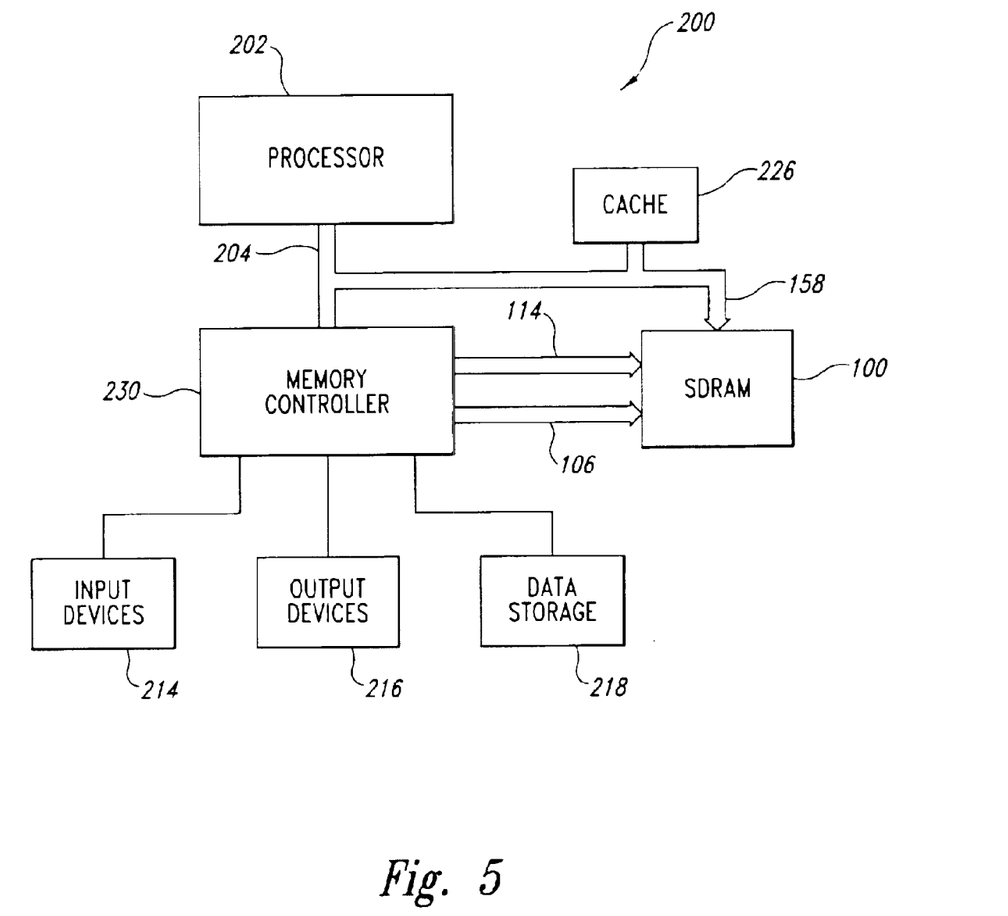
FIG. 5 is a block diagram of one embodiment of a computer system using the memory device of FIG. 4.

FIG. 5 shows a computer system 200 containing the SDRAM 100 of FIG. 4. The computer system 200 includes a processor 202 for performing various computing functions, such as executing specific software to perform specific calculations or tasks. The processor 202 includes a processor bus 204 that normally includes an address bus, a control bus, and a data bus, which includes the data strobe signal. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the SDRAM 100 through a memory controller 230. The memory controller 230 normally includes the control bus 106 (FIG. 4) and the address bus 114 that are coupled to the SDRAM 100. The data bus 158 is coupled from the SDRAM 100 to the processor bus 204 either directly (as shown), through the memory controller 230, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A data strobe circuit, comprising:
a first logic circuit coupled to receive a global data strobe signal and a first enable signal, the first logic circuit generating a first data strobe signal responsive to the global data strobe signal when the first enable signal is active;
a second logic circuit coupled to receive the global data strobe signal and a second enable signal, the second logic circuit generating a second data strobe signal responsive to the global data strobe signal when the second enable signal is active; and
a control circuit coupled to the first and second logic circuits, the control circuit receiving a write control signal, the control circuit being operable to generate the active first enable signal, the control circuit being operable to generate the active second enable signal responsive to receiving the write control signal being active after the active first enable signal is generated.

2. The data strobe circuit of claim 1 wherein the control circuit is operable to terminate the active first enable signal when the active second enable signal is generated.

3. The data strobe circuit of claim 1 wherein the control circuit comprises:
a flip-flop being set or reset responsive to a transition of a signal applied to control input of the flip-flop, the flip-flop having a first output coupled to an enable input of the first logic circuit and a second output coupled to an enable input of the second logic circuit, the first and second output being compliments of each other so that either the first logic circuit or the second logic circuit in enabled depending on whether the flip-flop is set or reset, respectively; and
a logic gate having an output coupled to the control input of the flip-flop, the logic gate receiving the first data strobe signal and the write control signal, the logic gate being enabled when the write control signal is active to allow the first data strobe signal to set or reset the flip-flop.

4. The data strobe circuit of claim 3 wherein the control input of the flip-flop comprises a clock input to the flip-flop so that a signal applied to the clock input sets or resets the flip-flop by toggling the flip-flop.

5. The data strobe circuit of claim 3 wherein the transition of the signal applied to the control input of the flip-flop sets the flip-flop, and wherein the data strobe circuit further comprises a logic gate having an output coupled to reset input of the flip-flop, the logic gate receiving the second data strobe signal to allow the second data strobe signal to reset the flip-flop.

6. The data strobe circuit of claim 1 wherein each of the first and second logic circuits further comprise a second enable input to enable or disable the first and second logic circuits, the second enable input of the first and second logic circuits being coupled to receive a data strobe write enable signal.

7. A data sampling circuit for sampling a data signal applied to a data terminal, the data sampling circuit comprising:
a plurality of data capture circuits each having a data input coupled to the data terminal, each of the data capture circuits further including a clock input coupled to receive a respective data strobe signal for sampling data applied to the data terminal responsive to the data strobe signal; and
a data strobe input circuit receiving a global data strobe signal and a write control signal, the data strobe input circuit being operable to generate successive data strobe signals applied to the clock inputs of successive ones of the data capture circuits responsive to the write control signal being active.

8. The data sampling circuit of claim 7 wherein the data capture circuits each comprise a flip-flop.

9. The data sampling circuit of claim 7 wherein the data strobe input circuit comprises:
a first logic circuit coupled to receive the global data strobe signal and a first enable signal, the first logic circuit generating first and second data strobe signals responsive to the global data strobe signal when the first enable signal is active, the first data strobe signal being applied to the clock input of a first of the data capture circuits and the second data strobe signal being applied to the clock input of a second of the data capture circuits;

a second logic circuit coupled to receive the global data strobe signal and a second enable signal, the second logic circuit generating third and fourth data strobe signals responsive to the global data strobe signal when the second enable signal is active, the third data strobe signal being applied to the clock input of a third of the data capture circuits and the fourth data strobe signal being applied to the clock input of a fourth of the data capture circuits; and a control circuit coupled to the first and second logic circuits, the control circuit receiving the write control signal, the control circuit being operable to generate the first enable signal and the second enable signal, the first enable signal being active responsive to receiving the write control signal being active, the second enable signal being active after the first enable signal is active.

10. The data sampling circuit of claim 9 wherein the control circuit is operable to make the first enable signal inactive responsive to generating the second enable signal being active.

11. The data sampling circuit of claim 9 wherein the control circuit comprises:
   a flip-flop being set or reset responsive to a transition of a signal applied to an control input of the flip-flop, the flip-flop having a first output coupled to an enable input of the first logic circuit and a second output coupled to an enable input of the second logic circuit, the first and second output being compliments of each other so that either the first logic circuit or the second logic circuit in enabled depending on whether the flip-flop is set or reset, respectively; and
   a logic gate having an output coupled to the control input of the flip-flop, the logic gate receiving the first data strobe signal and the write control signal, the logic gate being enabled when the write control signal is active to allow the first data strobe signal to set or reset the flip-flop.

12. The data sampling circuit of claim 11 wherein the control input of the flip-flop comprises a clock input to the flip-flop so that a signal applied to the clock input sets or resets the flip-flop by toggling the flip-flop.

13. The data sampling circuit of claim 11 wherein the transition of the signal applied to the control input of the flip-flop sets the flip-flop, and wherein the data strobe circuit further comprises a logic gate having an output coupled to reset input of the flip-flop, the logic gate receiving the second data strobe signal to allow the second data strobe signal to reset the flip-flop.

14. The data sampling circuit of claim 9 wherein each of the first and second logic circuits further comprise a second enable input to enable or disable the first and second logic circuits, the second enable input of the first and second logic circuits being coupled to receive a data strobe write enable signal.

15. The data sampling circuit of claim 9 wherein the first and second data strobe signals comprise the leading and trailing edges, respectively, of a first pulse generated responsive to the global data strobe signal, and the third and fourth data strobe signals comprise the leading and trailing edges, respectively, of a second pulse generated responsive to the global data strobe signal.

16. A memory device, comprising:
   a row address circuit operable to receive row address signals applied to an external terminal and to decode the row address signals to provide a row address;
   a column address circuit operable to receive column address signals applied to an external terminal and to decode the column address signals to provide a column address;
   at least one array of memory cells operable to store data written to or read from the array at a location determined by the row address and the column address;
   a data path circuit operable to couple data signals corresponding to the data between the at least one array and an external data terminal;
   a command signal generator operable to generate a sequence of control signals corresponding to command signals applied to an external terminal; and
   a data strobe circuit coupled to a component of the memory device, the data strobe circuit comprising:
      a first logic circuit coupled to receive a global data strobe signal and a first enable signal, the first logic circuit generating a first data strobe signal responsive to the global data strobe signal when the first enable signal is active;
      a second logic circuit coupled to receive the global data strobe signal and a second enable signal, the second logic circuit generating a second data strobe signal responsive to the global data strobe signal when the second enable signal is active; and
      a control circuit coupled to the first and second logic circuits, the control circuit receiving a write control signal, the control circuit being operable to make the first enable signal active, the control circuit further being operable to make the second enable signal active responsive to the write control signal being active after the first enable signal is active.

17. The memory device of claim 16 wherein the data strobe circuit is coupled to the data path circuit so that the first and second data strobe signals can be used to sample write data coupled the external data terminal.

18. The memory device of claim 16 wherein the control circuit is operable to make the first enable signal inactive when the second enable signal is active.

19. The memory device of claim 16 wherein the control circuit comprises:
   a flip-flop being set or reset responsive to a transition of a signal applied to an control input of the flip-flop, the flip-flop having a first output coupled to an enable input of the first logic circuit and a second output coupled to an enable input of the second logic circuit, the first and second output being compliments of each other so that either the first logic circuit or the second logic circuit in enabled depending on whether the flip-flop is set or reset, respectively; and
   a logic gate having an output coupled to the control input of the flip-flop, the logic gate receiving the first data strobe signal and the write control signal, the logic gate being enabled when the write control signal is active to allow the first data strobe signal to set or reset the flip-flop.

20. The memory device of claim 19 wherein the control input of the flip-flop comprises a clock input to the flip-flop so that a signal applied to the clock input sets or resets the flip-flop by toggling the flip-flop.

21. The memory device of claim 19 wherein the transition of the signal applied to the control input of the flip-flop sets the flip-flop, and wherein the data strobe circuit further comprises a logic gate having an output coupled to reset input of the flip-flop, the logic gate receiving the second data strobe signal to allow the second data strobe signal to reset the flip-flop.

22. The memory device of claim 16 wherein each of the first and second logic circuits further comprise a second enable input to enable or disable the first and second logic circuits, the second enable input of the first and second logic circuits being coupled to receive a data strobe write enable signal.

23. The memory device of claim 16 wherein the memory device comprises a dynamic random access memory device.

24. The memory device of claim 16 wherein the global data strobe signal is applied to an externally accessible terminal of the memory device.

25. A memory device operating in synchronism with a clock signal, comprising:
   a row address circuit operable to receive row address signals applied to an external terminal and to decode the row address signals to provide a row address;
   a column address circuit operable to receive column address signals applied to an external terminal and to decode the column address signals to provide a column address;
   at least one array of memory cells operable to store data written to or read from the array at a location determined by the row address and the column address;
   a data path circuit operable to couple data signals corresponding to the data between the at least one array and an external data terminal, the data path circuit including a write data path comprising:
      a plurality of data capture circuits each having a data input coupled to the external data terminal, each of the data capture circuits further including a clock input coupled to receive a respective data strobe signal for sampling data applied to the external data terminal responsive to the data strobe signal; and
      a data strobe input circuit receiving a global data strobe signal and a write control signal, the data strobe input circuit being operable to generate successive data strobe signals applied to the clock inputs of successive ones of the data capture circuits responsive to the write control signal being active; and
   a command signal generator operable to generate a sequence of control signals corresponding to command signals applied to an external command terminal.

26. The memory device of claim 25 wherein the write control signal comprises a write signal generated a predetermined number of clock signal periods prior to internally writing data to the array of memory cells.

27. The memory device of claim 25 wherein the data capture circuits each comprise a flip-flop.

28. The memory device of claim 25 wherein the data strobe input circuit comprises:
   a first logic circuit coupled to receive the global data strobe signal and a first enable signal, the first logic circuit generating first and second data strobe signals responsive to the global data strobe signal when the first enable signal is active, the first data strobe signal being applied to the clock input of a first of the data capture circuits, and the second data strobe signal being applied to the clock input of a second of the data capture circuits;
   a second logic circuit coupled to receive the global data strobe signal and a second enable signal, the second logic circuit generating third and fourth data strobe signals responsive to the global data strobe signal when the second enable signal is active, the third data strobe signal being applied to the clock input of a third of the data capture circuits and the fourth data strobe signal being applied to the clock input of a fourth of the data capture circuits; and
   a control circuit coupled to the first and second logic circuits, the control circuit receiving the write control signal, the control circuit being operable to make the first enable signal active responsive to the write control signal being active, the control circuit further being operable to make the second enable signal active after the first enable signal is active.

29. The memory device of claim 28 wherein the control circuit is operable to make the first enable signal inactive responsive to the second enable signal being active.

30. The memory device of claim 28 wherein the control circuit comprises:
   a flip-flop being set or reset responsive to a transition of a signal applied to an control input of the flip-flop, the flip-flop having a first output coupled to an enable input of the first logic circuit and a second output coupled to an enable input of the second logic circuit, the first and second output being compliments of each other so that either the first logic circuit or the second logic circuit in enabled depending on whether the flip-flop is set or reset, respectively; and
   a logic gate having an output coupled to the control input of the flip-flop, the logic gate receiving the first data strobe signal and the write control signal, the logic gate being enabled when the write control signal is active to allow the first data strobe signal to set or reset the flip-flop.

31. The memory device of claim 30 wherein the control input of the flip-flop comprises a clock input to the flip-flop so that a signal applied to the clock input sets or resets the flip-flop by toggling the flip-flop.

32. The memory device of claim 30 wherein the transition of the signal applied to the control input of the flip-flop sets the flip-flop, and wherein the data strobe circuit further comprises a logic gate having an output coupled to reset input of the flip-flop, the logic gate receiving the second data strobe signal to allow the second data strobe signal to reset the flip-flop.

33. The memory device of claim 28 wherein each of the first and second logic circuits further comprise a second enable input to enable or disable the first and second logic circuits, the second enable input of the first and second logic circuits being coupled to receive a data strobe write enable signal.

34. The memory device of claim 28 wherein the first and second data strobe signals comprise the leading and trailing edges, respectively, of a first pulse generated responsive to the global data strobe signal, and the third and fourth data strobe signals comprise the leading and trailing edges, respectively, of a second pulse generated responsive to the global data strobe signal.

35. The memory device of claim 25 wherein the memory device comprises a synchronous dynamic random access memory device.

36. The memory device of claim 25 wherein the global data strobe signal is applied to an externally accessible terminal of the memory device.

37. A computer system, comprising:
   a processor having a processor bus;
   an input device coupled to the processor through the processor bus adapted to allow data to be entered into the computer system;
   an output device coupled to the processor through the processor bus adapted to allow data to be output from the computer system; and
   a memory device coupled to the processor bus adapted to allow data to be stored, the memory device comprising:
      a row address circuit operable to receive row address signals applied to an external terminal and to decode the row address signals to provide a row address;

a column address circuit operable to receive column address signals applied to an external terminal and to decode the column address signals to provide a column address;

at least one array of memory cells operable to store data written to or read from the array at a location determined by the row address and the column address;

a data path circuit operable to couple data signals corresponding to the data between the at least one array and an external data terminal;

a command signal generator operable to generate a sequence of control signals corresponding to command signals applied to an external terminal; and a data strobe circuit coupled to a component of the memory device, the data strobe circuit comprising:

a first logic circuit coupled to receive a global data strobe signal and a first enable signal, the first logic circuit generating a first data strobe signal responsive to the global data strobe signal when the first enable signal is active;

a second logic circuit coupled to receive the global data strobe signal and a second enable signal, the second logic circuit generating a second data strobe signal responsive to the global data strobe signal when the second enable signal is active; and a control circuit coupled to the first and second logic circuits, the control circuit receiving a write control signal, the control circuit being operable to generate make the first enable signal active and to make the second enable signal active responsive to receiving the write control signal being active after the first enable signal is active.

38. The computer system of claim 37 wherein the data strobe circuit is coupled to the data path circuit so that the first and second data strobe signals can be used to sample write data coupled the external data terminal.

39. The computer system of claim 37 wherein the control circuit is operable to make the first enable signal inactive when the second enable signal is inactive.

40. The computer system of claim 37 wherein the control circuit comprises:

a flip-flop being set or reset responsive to a transition of a signal applied to an control input of the flip-flop, the flip-flop having a first output coupled to an enable input of the first logic circuit and a second output coupled to an enable input of the second logic circuit, the first and second output being compliments of each other so that either the first logic circuit or the second logic circuit in enabled depending on whether the flip-flop is set or reset, respectively; and a logic gate having an output coupled to the control input of the flip-flop, the logic gate receiving the first data strobe signal and the write control signal, the logic gate being enabled when the write control signal is active to allow the first data strobe signal to set or reset the flip-flop.

41. The computer system of claim 40 wherein the control input of the flip-flop comprises a clock input to the flip-flop so that a signal applied to the clock input sets or resets the flip-flop by toggling the flip-flop.

42. The computer system of claim 40 wherein the transition of the signal applied to the control input of the flip-flop sets the flip-flop, and wherein the data strobe circuit farther comprises a logic gate having an output coupled to reset input of the flip-flop, the logic gate receiving the second data strobe signal to allow the second data strobe signal to reset the flip-flop.

43. The computer system of claim 37 wherein each of the first and second logic circuits further comprise a second enable input to enable or disable the first and second logic circuits, the second enable input of the first and second logic circuits being coupled to receive a data strobe write enable signal.

44. The computer system of claim 37 wherein the memory device comprises a dynamic random access memory device.

45. The computer system of claim 37 wherein the global data strobe signal is applied to an externally accessible terminal of the memory device.

46. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a synchronous memory device operating in synchronism with a clock signal, the synchronous memory device being coupled to the processor bus adapted to allow data to be stored, the synchronous memory device comprising:

a row address circuit operable to receive row address signals applied to an external terminal and to decode the row address signals to provide a row address;

a column address circuit operable to receive column address signals applied to an external terminal and to decode the column address signals to provide a column address;

at least one array of memory cells operable to store data written to or read from the array at a location determined by the row address and the column address;

a data path circuit operable to couple data signals corresponding to the data between the at least one array and an external data terminal, the data path circuit including a write data path comprising:

a plurality of data capture circuits each having a data input coupled to the external data terminal, each of the data capture circuits further including a clock input coupled to receive a respective data strobe signal for sampling data applied to the external data terminal responsive to the data strobe signal; and a data strobe input circuit receiving a global data strobe signal and a write control signal, the data strobe input circuit being operable to generate successive data strobe signals applied to the clock inputs of successive ones of the data capture circuits responsive to the write control signal being active; and a command signal generator operable to generate a sequence of control signals corresponding to command signals applied to an external command terminal.

47. The computer system of claim 46 wherein the write control signal comprises a write signal generated a predetermined number of clock signal periods prior to internally writing data to the array of memory cells.

48. The computer system of claim 46 wherein the data capture circuits each comprise a flip-flop.

49. The computer system of claim 46 wherein the data strobe input circuit comprises:

a first logic circuit coupled to receive the global data strobe signal and a first enable signal, the first logic circuit generating first and second data strobe signals responsive to the global data strobe signal when the first enable signal is active, the first data strobe signal being applied to the clock input of a first of the data capture circuits and the second data strobe signal being applied to the clock input of a second of the data capture circuits;

a second logic circuit coupled to receive the global data strobe signal and a second enable signal, the second logic circuit generating third and fourth data strobe signals responsive to the global data strobe signal when the second enable signal is active, the third data strobe signal being applied to the clock input of a third of the data capture circuits and the fourth data strobe signal being applied to the clock input of a fourth of the data capture circuits; and a control circuit coupled to the first and second logic circuits, the control circuit receiving the write control signal, the control circuit being operable to make the first enable signal active responsive to the write control signal being active, the control circuit further being operable to make the second enable signal active after the first enable signal is active.

50. The computer system of claim 49 wherein the control circuit is operable to make the first enable signal inactive responsive to the second enable signal being active.

51. The computer system of claim 49 wherein the control circuit comprises:

a flip-flop being set or reset responsive to a transition of a signal applied to an control input of the flip-flop, the flip-flop having a first output coupled to an enable input of the first logic circuit and a second output coupled to an enable input of the second logic circuit, the first and second output being compliments of each other so that either the first logic circuit or the second logic circuit in enabled depending on whether the flip-flop is set or reset, respectively; and a logic gate having an output coupled to the control input of the flip-flop, the logic gate receiving the first data strobe signal and the write control signal, the logic gate being enabled when the write control signal is active to allow the first data strobe signal to set or reset the flip-flop.

52. The computer system of claim 51 wherein the control input of the flip-flop comprises a clock input to the flip-flop so that a signal applied to the clock input sets or resets the flip-flop by toggling the flip-flop.

53. The computer system of claim 51 wherein the transition of the signal applied to the control input of the flip-flop sets the flip-flop, and wherein the data strobe circuit further comprises a logic gate having an output coupled to reset input of the flip-flop, the logic gate receiving the second data strobe signal to allow the second data strobe signal to reset the flip-flop.

54. The computer system of claim 49 wherein each of the first and second logic circuits further comprise a second enable input to enable or disable the first and second logic circuits, the second enable input of the first and second logic circuits being coupled to receive a data strobe write enable signal.

55. The computer system of claim 49 wherein the first and second data strobe signals comprise the leading and trailing edges, respectively, of a first pulse generated responsive to the global data strobe signal, and the third and fourth data strobe signals comprise the leading and trailing edges, respectively, of a second pulse generated responsive to the global data strobe signal.

56. The computer system of claim 43 wherein the memory device comprises a synchronous dynamic random access memory device.

57. The computer system of claim 46 wherein the global data strobe signal is applied to an externally accessible terminal of the memory device.

58. A method of generating data strobe pulses responsive to global data strobe pulses, the method comprises:

generating a first data strobe pulse responsive to a first of the global data strobe pulses; and generating a second data strobe pulse responsive to a second of the global data strobe pulses only if a write command is active, the second data strobe pulse being generated by determining if the first data strobe pulse was generated responsive to the first of the global data strobe pulses, and, if so, generating the second data strobe pulse responsive to the second of the global data strobe pulses.

59. A method of sampling a data signal responsive to a global data strobe pulse, the method comprises:

periodically sampling the data signal using a first storage device responsive to each of a plurality of global data strobe pulses; and in the event a write command becomes active, discontinuing sampling the data signal using the first storage device responsive to the global data strobe pulses and sampling the data signal using a second storage device responsive to a respective global data strobe pulse.

60. A method of generating data strobe pulses responsive to global data strobe pulses present on a signal line on which noise pulses may be present in a preamble prior to a first of the global data strobe pulses, the method comprising:

generating a first data strobe pulse responsive to the first of the global data strobe pulses present on the signal line;

generating a second data strobe pulse responsive to a second of the global data strobe pulses present on the signal line; and inhibiting either the first or the second data strobe pulse from being generated responsive to noise pulses present on the signal line during the preamble.

61. The method of claim 60 wherein the act of inhibiting either the first or the second data strobe pulse from being generated responsive to noise pulses present on the signal line comprises:

checking if a write control signal is present when the noise pulses are generated; and if the write control signal is not present, preventing the second data strobe pulse from being generated responsive to the noise pulse.

62. The method of claim 60 wherein the act of inhibiting either the first or the second data strobe pulse from being generated responsive to noise pulses present on the signal line comprises:

checking if a write control signal is present;

as long as the write control signal is not present, generating the first data strobe pulse responsive to each pulse on the signal line including global data strobe pulses and noise pulses;

when the write control signal becomes present, discontinuing the first data strobe pulses from being generated responsive to each pulse on the signal line including the global data strobe pulses and the noise pulses; and when the write control signal becomes present, generating the second data strobe pulse responsive to the global data strobe pulses.

* * * * *

UNITED STATES PATENT AND TRADEMARK OFFICE
CERTIFICATE OF CORRECTION

PATENT NO. : 6,922,367 B2
APPLICATION NO. : 10/617246
DATED : July 26, 2005
INVENTOR(S) : Christopher K. Morzano and Wen Li It is certified that error appears in the above-identified patent and that said Letters Patent is hereby corrected as shown below:

| Column, Line | Reads | Should Read |
| --- | --- | --- |
| Item (57), Line 3 | "respective enable signal" | --a respective enable signal-- |
| Column 1, Line 51 | "conventional DDR memory device," | --conventional DDR memory devices,-- |
| Column 2, Line 31 | "diagram a data strobe" | --diagram of a data strobe-- |
| Column 3, Lines 31 and 32 | "complimentary" | --complementary-- |
| Column 3, Line 57 | "compliment" | --complement-- |
| Column 3, Lines 65-67 | "Returning to FIG. 1, since the logic circuits 46, 48, the ENA and ENB signals that enable the logic circuits 46, 48 are generated by a flip-flop." | --Returning to FIG. 1, since the ENA and ENB signals that enable the logic circuits 46, 48 are generated by a flip-flop 60, they are enabled at the same time,-- |
| Column 5, Line 62 | "through the nor gate" | --through the NOR gate-- |
| Column 6, Line 9 | "and RAMBUS DRAMs (RDRAMS")," | --and RAMBUS DRAMs ("RDRAMS"),-- |
| Colum 6, Line 18 | "memory arrays 120, 12" | --memory arrays 120, 122-- |
| Column 7, Line 5 | "which the" | --with the-- |
| Column 8, Line 9 | "applied to control input" | --applied to a control input-- |
| Column 8, Line 13 | "being compliments" | --being complements-- |
| Column 8, Lines 14-15 | "logic circuit in enabled" | --logic circuit is enabled-- |
| Column 8, Line 30 | "coupled to reset" | --coupled to the reset-- |
| Column 9, Line 23 | "applied to an control input" | --applied to a control input-- |
| Column 9, Line 27 | "compliments" | --complements-- |
| Column 9, Lines 28-29 | "logic circuit in enabled" | --logic circuit is enabled-- |
| Column 9, Lines 43-44 | "coupled to reset input" | --coupled to the reset input-- |
| Column 10, Line 33 | "coupled the external data terminal" | --coupled to the external data terminal-- |
| Column 10, Line 40 | "applied to an control input" | --applied to a control input-- |
| Column 10, Line 44 | "being compliments" | --being complements-- |
| Column 10, Lines 45-46 | "second logic circuit in enable" | --second logic circuit is enabled-- |

UNITED STATES PATENT AND TRADEMARK OFFICE
CERTIFICATE OF CORRECTION

PATENT NO. : 6,922,367 B2
APPLICATION NO. : 10/617246
DATED : July 26, 2005
INVENTOR(S) : Christopher K. Morzano and Wen Li It is certified that error appears in the above-identified patent and that said Letters Patent is hereby corrected as shown below:

| Column, Line | Reads | Should Read |
|---|---|---|
| Column 10, Line 61 | "coupled to reset" | --coupled to the reset-- |
| Column 12, Line 12 | "applied to an control input" | --applied to a control input-- |
| Column 12, Line 16 | "compliments" | --complements-- |
| Column 12, Lines 17-18 | "logic circuit in enabled" | --logic circuit is enabled-- |
| Column 13, Lines 28-29 | "being operable to generate make the first enable signal" | --being operable to make the first enable signal-- |
| Column 13, Line 43 | "applied to an control input" | --applied to a control input-- |
| Column 13, Line 47 | "compliments" | --complements-- |
| Column 13, Line 48-49 | "logic circuit in enabled" | --logic circuit is enabled-- |
| Column 13, Line 63 | "circuit farther" | --circuit further-- |
| Column 15, Line 28 | "applied to an control input" | --applied to a control input-- |
| Column 15, Line 32 | "compliments" | --complements-- |
| Column 15, Lines 33-34 | "logic circuit in enabled" | --logic circuit is enabled-- |
| Column 16, Lines 5 and 17 | "the method comprises:" | --the method comprising:-- |

Signed and Sealed this

Twenty-fifth Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 6,922,367 B2
APPLICATION NO. : 10/617246
DATED : July 26, 2005
INVENTOR(S) : Christopher K. Morzano and Wen Li It is certified that error appears in the above-identified patent and that said Letters Patent is hereby corrected as shown below:

| Column, Line | Reads | Should Read |
|---|---|---|
| Item (57), Line 3 | "respective enable signal" | --a respective enable signal-- |
| Column 1, Line 51 | "conventional DDR memory device," | --conventional DDR memory devices,-- |
| Column 2, Line 31 | "diagram a data strobe" | --diagram of a data strobe-- |
| Column 3, Lines 31 and 32 | "complimentary" | --complementary-- |
| Column 3, Line 57 | "compliment" | --complement-- |
| Column 3, Lines 65-67 | "Returning to FIG. 1, since the logic circuits 46, 48, the ENA and ENB signals that enable the logic circuits 46, 48 are generated by a flip-flop." | --Returning to FIG. 1, since the ENA and ENB signals that enable the logic circuits 46, 48 are generated by a flip-flop 60, they are enabled at the same time.-- |
| Column 5, Line 62 | "through the nor gate" | --through the NOR gate-- |
| Column 6, Line 9 | "and RAMBUS DRAMs (RDRAMS")," | --and RAMBUS DRAMs ("RDRAMS"),-- |
| Colum 6, Line 18 | "memory arrays 120, 12" | --memory arrays 120, 122-- |
| Column 7, Line 5 | "which the" | --with the-- |
| Column 8, Line 9 | "applied to control input" | --applied to a control input-- |
| Column 8, Line 13 | "being compliments" | --being complements-- |
| Column 8, Lines 13-14 | "logic circuit in enabled" | --logic circuit is enabled-- |
| Column 8, Line 30 | "coupled to reset" | --coupled to the reset-- |
| Column 9, Line 23 | "applied to an control input" | --applied to a control input-- |
| Column 9, Line 27 | "compliments" | --complements-- |
| Column 9, Lines 28-29 | "logic circuit in enabled" | --logic circuit is enabled-- |
| Column 9, Lines 43-44 | "coupled to reset input" | --coupled to the reset input-- |
| Column 10, Line 33 | "coupled the external data terminal" | --coupled to the external data terminal-- |
| Column 10, Line 40 | "applied to an control input" | --applied to a control input-- |
| Column 10, Line 44 | "being compliments" | --being complements-- |
| Column 10, Lines 45-46 | "second logic circuit in enable" | --second logic circuit is enabled-- |

UNITED STATES PATENT AND TRADEMARK OFFICE
CERTIFICATE OF CORRECTION

PATENT NO.       : 6,922,367 B2
APPLICATION NO.  : 10/617246
DATED            : July 26, 2005
INVENTOR(S)      : Christopher K. Morzano and Wen Li It is certified that error appears in the above-identified patent and that said Letters Patent is hereby corrected as shown below:

| Column, Line | Reads | Should Read |
|---|---|---|
| Column 10, Line 61 | "coupled to reset" | --coupled to the reset-- |
| Column 12, Line 12 | "applied to an control input" | --applied to a control input-- |
| Column 12, Line 16 | "compliments" | --complements-- |
| Column 12, Lines 17-18 | "logic circuit in enabled" | --logic circuit is enabled-- |
| Column 13, Lines 28-29 | "being operable to generate make the first enable signal" | --being operable to make the first enable signal-- |
| Column 13, Line 43 | "applied to an control input" | --applied to a control input-- |
| Column 13, Line 47 | "compliments" | --complements-- |
| Column 13, Line 48-49 | "logic circuit in enabled" | --logic circuit is enabled-- |
| Column 13, Line 63 | "circuit farther" | --circuit further-- |
| Column 15, Line 28 | "applied to an control input" | --applied to a control input-- |
| Column 15, Line 32 | "compliments" | --complements-- |
| Column 15, Lines 33-34 | "logic circuit in enabled" | --logic circuit is enabled-- |
| Column 16, Lines 5 and 17 | "the method comprises:" | --the method comprising:-- |

This certificate supersedes the Certificate of Correction issued December 25, 2007.

Signed and Sealed this

Thirteenth Day of May, 2008

JON W. DUDAS
*Director of the United States Patent and Trademark Office*